(12) United States Patent
Ishida

(10) Patent No.: US 7,077,552 B2
(45) Date of Patent: Jul. 18, 2006

(54) VEHICLE HEAD LAMP

(75) Inventor: Hiroyuki Ishida, Shizuoka (JP)

(73) Assignee: Koito Manufacturing Co. Ltd., Tokyo (JP)

( * ) Notice: Subject to any disclaimer, the term of this patent is extended or adjusted under 35 U.S.C. 154(b) by 7 days.

(21) Appl. No.: 10/827,273

(22) Filed: Apr. 20, 2004

(65) Prior Publication Data

US 2004/0223337 A1    Nov. 11, 2004

(30) Foreign Application Priority Data

Apr. 23, 2003   (JP) .......................... P.2003-119130

(51) Int. Cl.
*F21S 8/10*    (2006.01)

(52) U.S. Cl. ...................... 362/545; 362/538; 362/465; 313/510

(58) Field of Classification Search ................ 362/545, 362/517, 249, 538, 520, 244, 246, 800; 313/498, 313/500, 510
See application file for complete search history.

(56) References Cited

U.S. PATENT DOCUMENTS 4,646,207 A * 2/1987 Levin et al. ................ 362/522
5,779,341 A * 7/1998 Chinniah et al. ........... 362/507
6,450,663 B1 * 9/2002 Reinbach ..................... 362/249
6,619,825 B1 * 9/2003 Natsume ..................... 362/509
6,672,746 B1 * 1/2004 Amano ....................... 362/545
6,698,911 B1 * 3/2004 Naganawa et al. ......... 362/464
2003/0156425 A1 * 8/2003 Turnbull et al. ............ 362/545

FOREIGN PATENT DOCUMENTS

| JP | 2002-87153 A | 3/2002 |
| JP | 2002-216506 A | 8/2002 |

* cited by examiner

*Primary Examiner*—Renee Luebke
*Assistant Examiner*—Evan Dzierzynski

(57) ABSTRACT

A lighting device unit which conducts illumination for forming an upward protrusion has a light source including a light emitting diode in which three light emitting chips are horizontally arranged, and a projection lens which projects an image of the light source toward the front of the lighting device as an inverted image. The inverted images of the light emitting chips of the light source formed respectively on a virtual vertical screen in front of the lighting device are horizontally shifted from one another. When a vehicle moves straight forward, the first light emitting chip is turned ON; when the vehicle turns leftward, the second light emitting chip is turned ON; and, when the vehicle turns rightward, the third light emitting chip is turned ON. The position where the upward protrusion is formed is horizontally moved to brightly illuminate the road surface in the traveling direction of the vehicle.

14 Claims, 16 Drawing Sheets

VEHICLE HEAD LAMP

The present invention claims foreign priority based on Japanese application no. JP-2003-119130, filed Apr. 23, 2003, the contents of which is incorporated herein by reference.

BACKGROUND OF THE INVENTION

1. Technical Field

The present invention relates to a vehicle head lamp that forms a luminous distribution pattern having a horizontal cutoff line in an upper end portion and an upward protrusion that upward protrudes from the horizontal cutoff line.

2. Related Art

Japanese publication JP-A-2002-216506 discloses a related art vehicle head lamp is configured so as to form a luminous distribution pattern having: a horizontal cutoff line in an upper end portion; and an upward protrusion that upward protrudes from the horizontal cutoff line, whereby the remote visibility of the driver of the present vehicle is ensured without forming glare light for the driver of an oncoming vehicle.

The vehicle head lamp disclosed in JP '506 has a configuration wherein a second reflector which conducts illumination for forming the upward protrusion is supported by a lighting device unit body so as to be horizontally swingable. When the second reflector is swung horizontally, the position of the upward protrusion can be horizontally moved along the horizontal cutoff line.

Furthermore, Japanese publication JP-A-2002-87153 discloses a related art vehicle cornering lamp comprising plural reflector units having different light emitting directions.

To enhance the remote visibility during turning of a vehicle, it is desired to sufficiently illuminate the road surface positioned obliquely in front of the vehicle or in the traveling direction of the vehicle.

When the second reflector is swung during turning of a vehicle as disclosed in JP '506, it is possible to brightly illuminate the road surface in the traveling direction of the vehicle without using a vehicle cornering lamp.

When the vehicle head lamp disclosed in JP '506 is employed, however, there arises a related art problem in that the configuration of the related art lighting device is complicated and bulky.

SUMMARY OF THE INVENTION

It is an object of the invention to provide a vehicle head lamp configured to form a luminous distribution pattern having a horizontal cutoff line in an upper end portion, and in which the remote visibility during turning of a vehicle can be enhanced by a simple and compact configuration of a lighting device. However, it is not necessary for the present invention to achieve this object, or any other object.

According to the invention, an upward protrusion is formed by illumination from a lighting device unit which uses a semiconductor light emitting device as a light source, and a method of forming a luminous distribution pattern by the lighting device unit is improved, thereby attaining the object.

The vehicle head lamp of the invention is a vehicle head lamp which is configured so as to form a luminous distribution pattern having: a horizontal cutoff line in an upper end portion; and an upward protrusion that upward protrudes from the horizontal cutoff line, wherein the lamp comprises one or more lighting device units which conduct illumination for forming the upward protrusion, and each of the lighting device units comprises: a light source configured by a semiconductor light emitting device which has a plurality of light emitting chips that are arranged in a row, and which is placed with being forward directed while the light emitting chips are horizontally arranged; and a projection lens which is disposed in front of the light source, and which projects an image of the light source toward a front of a lighting device, the image being an inverted image.

In the above, the "luminous distribution pattern having: a horizontal cutoff line in an upper end portion; and an upward protrusion that upward protrudes from the horizontal cutoff line" may be a so-called low-beam luminous distribution pattern, or another luminous distribution pattern.

In the above, the specific shape of the "upward protrusion" is not particularly restricted as far as it upward protrudes from the horizontal cutoff line. For example, the protrusion may be formed into an approximate sector shape in which an oblique cutoff line that is raised at a predetermined angle from the horizontal cutoff line is formed as one side, or a shape which is stepwise raised with respect to the horizontal cutoff line.

The lighting device configuration for forming the "horizontal cutoff line", and that for forming other portions of the "luminous distribution pattern" are not particularly restricted.

The kind of "semiconductor light emitting device" is not particularly restricted. For example, a light emitting diode or a laser diode may be employed.

The specific configuration such as the shape and size of each of "light emitting chips" is not particularly restricted.

As indicated in the above configuration, the vehicle head lamp of the invention is configured so as to form a luminous distribution pattern having: a horizontal cutoff line in an upper end portion; and an upward protrusion that upward protrudes from the horizontal cutoff line, and comprises one or more lighting device units which conduct illumination for forming the upward protrusion. Each of the lighting device units comprises: a light source configured by a semiconductor light emitting device which has a plurality of light emitting chips that are arranged in a row, and which is placed with being forward directed while the light emitting chips are horizontally arranged; and a projection lens which is disposed in front of the light source, and which projects an image of the light source toward a front of the lighting device unit, the image being an inverted image. Therefore, the head lamp can attain at least the following functions and effects.

In the light source of each of the lighting device units, the light emitting chips constituting the light source are placed with being forward directed in a state where the chips are horizontally arranged. Therefore, inverted images of the light emitting chips of the light source projected via the projection lens onto a virtual vertical screen in front of the lighting device are formed at positions that are horizontally shifted from one another. When the light emitting chips are controlled so as to sequentially emit light during turning of a vehicle, the position where the upward protrusion is formed can be sequentially horizontally moved, whereby the road surface in the traveling direction of the vehicle can be brightly illuminated.

Since each of the lighting device units comprises the light source formed by the semiconductor light emitting device, and the projection lens disposed in front of the light source, the lighting device unit can be configured in a simple and compact manner.

According to the invention, in a vehicle head lamp configured to form a luminous distribution pattern having a horizontal cutoff line in an upper end portion, the remote visibility during turning of a vehicle can be enhanced by a simple and compact configuration of a lighting device.

In the above configuration, the light emitting chips may be arranged on a focal plane of the projection lens. According to the configuration, even when the projection lens has a large field curvature, the inverted image of the light source which is projected onto the virtual vertical screen as a result of light emission of each light emitting chip can be formed as an image of a clear outline. Therefore, the remote visibility can be sufficiently enhanced, and glare light can be effectively prevented from being produced.

In the above configuration, each of the light emitting chips may have an approximate parallelogram shape. According to the configuration, the inverted image of the light source projected onto the virtual vertical screen can be formed so that the side edge is obliquely raised from the horizontal cutoff line in a state where the lower edge is set to be substantially horizontal. When the lower edge of the inverted image is substantially horizontal, the road surface in front of the vehicle can be effectively prevented from being unevenly illuminated. Since the inverted image is formed so that the side edge is obliquely raised from the horizontal cutoff line, the remote visibility of the driver of the present vehicle can be further enhanced without forming glare light for the driver of an oncoming vehicle.

In the above configuration, one or plural lighting device units which conduct illumination for forming the upward protrusion can be used. When plural lighting device units are used, the upward protrusion can be made brighter, and hence the road surface in the traveling direction of the vehicle can be illuminated more brightly.

In this case, plural kinds of lighting device units in which arrangement pitches of the light emitting chips constituting the light sources are slightly different from one another by a predetermined amount may be used as the plural lighting device units, whereby the following function and effect can be attained.

When, in the plural kinds of lighting device unit, the light emitting chips shifted from one another by the predetermined amount are controlled to sequentially emit light during turning of the vehicle, the position where the upward protrusion is formed can be gradually horizontally moved, whereby the possibility that a useless sense of discomfort due to switching of light emission of light emitting chips arises in the driver of the present vehicle can be reduced.

In the above configuration, the projection lens of each of the lighting device units may be integrated with the light source to hermetically seal the light emitting chips of the light source. According to the configuration, the lighting device unit can be formed as a light source unit so as to have a simpler configuration. In this case, it is possible to prevent an air layer from being interposed between the light source and the projection lens. Therefore, interface reflection can be eliminated, so that fluxes of the light source can be effectively used.

DETAILED DESCRIPTION OF THE INVENTION

Hereinafter, an exemplary, non-limiting embodiment of the present invention will be described with reference to the accompanying drawings.

Figure 1:
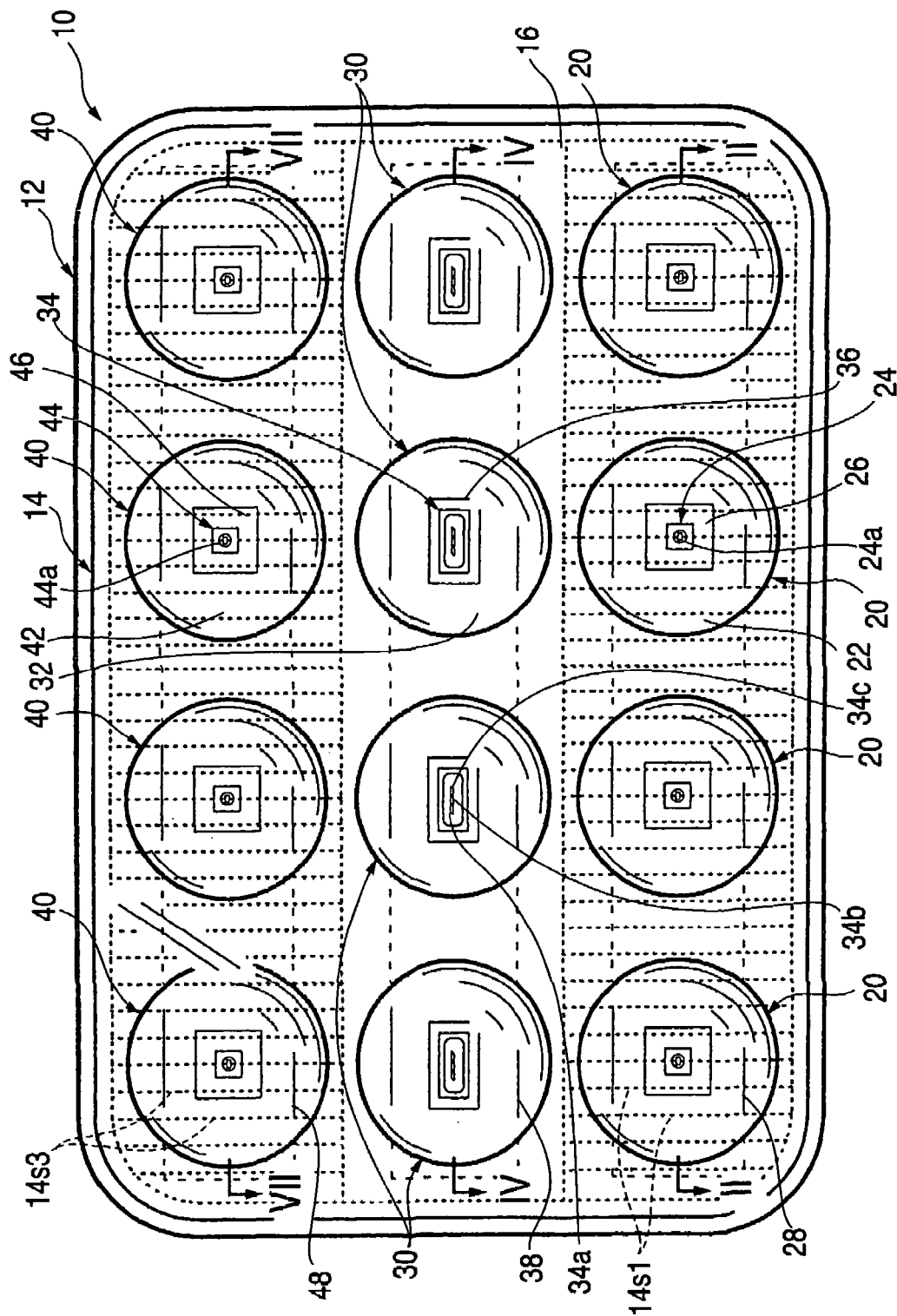
FIG. 1 is a front view showing a vehicle head lamp of an exemplary, non-limiting embodiment of the present invention.

FIG. 1 is a front view showing a vehicle head lamp of an embodiment of the invention. In the vehicle head lamp 10 of the embodiment, twelve lighting device units are housed in three rows vertically arranged in a lamp housing formed by a lamp body 12 and a transparent cover 14 attached to a front end opening of the body. Namely, four lighting device units 20 are placed in the lower row, four lighting device units 30 are placed in the middle row, and four lighting device units 40 are placed in the upper row.

In the transparent cover 14, a strip region in the middle in the vertical direction is formed in a plain state. In the lower region, plural diffusion lens elements 14s1 for horizontally diffusing light emitted from the four lighting device units 20 in the lower row are formed in a vertically-striped pattern, and in the upper region, plural diffusion lens elements 14s3 for horizontally diffusing light emitted from the four lighting device units 40 in the upper row are formed in a vertically-striped pattern. In rear of the transparent cover 14, a unit holder 16 is disposed so as to surround the twelve lighting device units.

Figure 2:
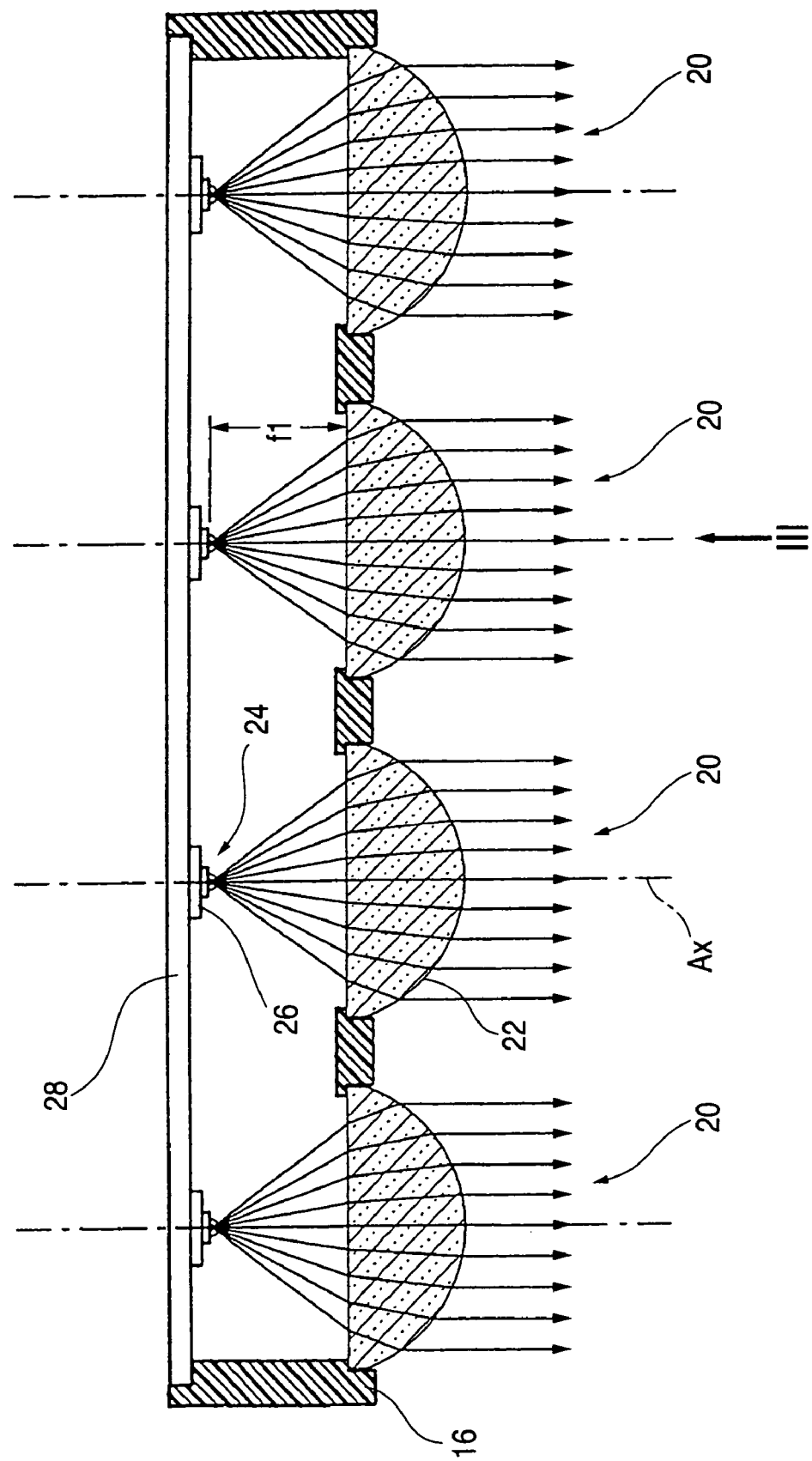
FIG. 2 is a section view taken along the line II—II of FIG. 1 according to the exemplary, non-limiting embodiment of the present invention.
Figure 3:
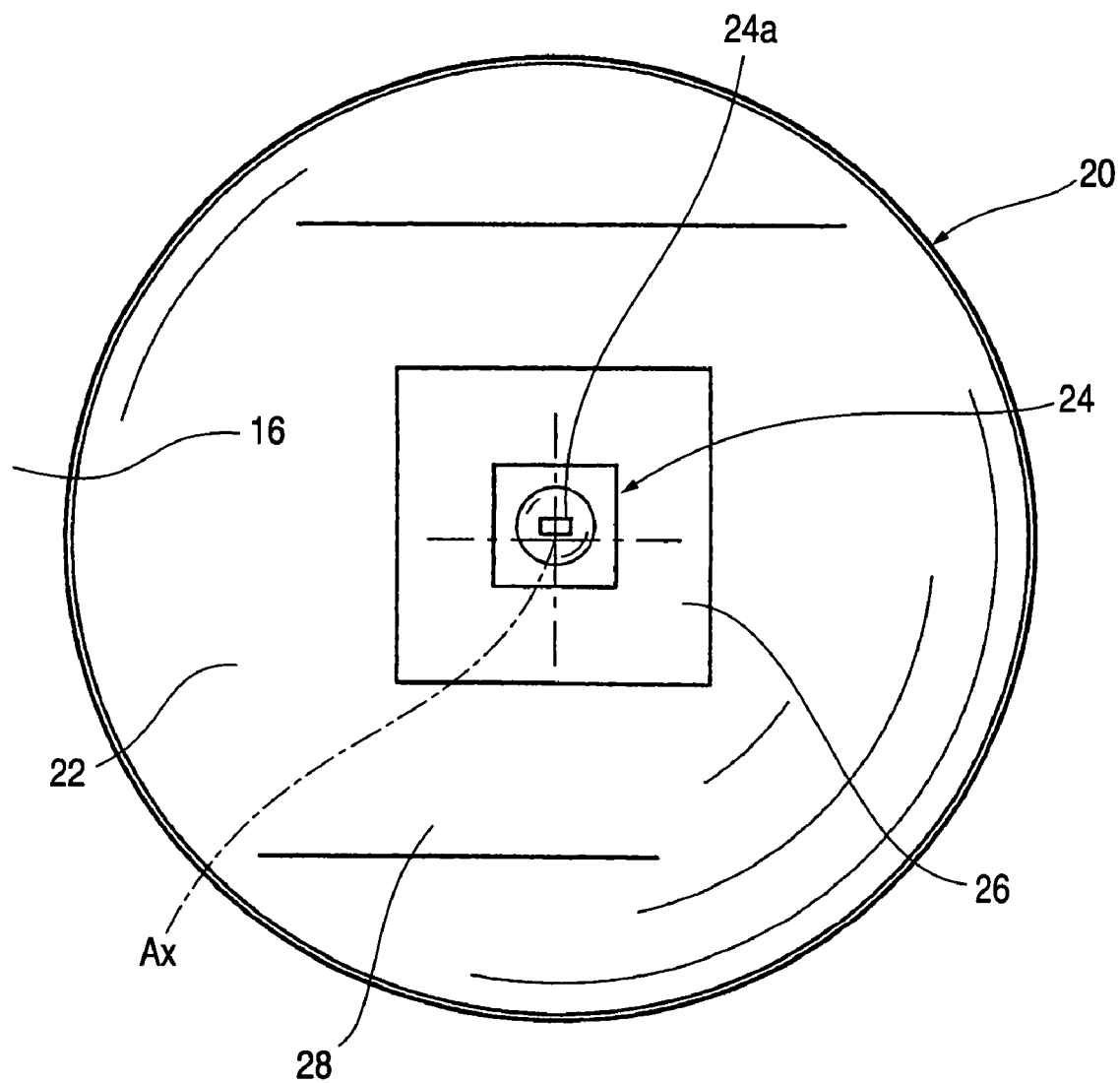
FIG. 3 is a detail view looking in the direction of the arrow III in FIG. 2 according to the exemplary, non-limiting embodiment of the present invention.

FIG. 2 is a section view taken along the line II—II of FIG. 1, and FIG. 3 is a detail view looking in the direction of the arrow III in FIG. 2. Each of the lighting device units 20 in the lower row comprises: a projection lens 22 which is placed on an optical axis Ax elongating in the longitudinal direction of the vehicle; a light source 24 configured by a light emitting diode placed and forward directed in the vicinity of the rear focal point of the projection lens 22; and a substrate 26 to which the light source 24 is attached. The lighting device units 20 project images of their light sources 24 as inverted images toward the front of the lighting device by means of the projection lenses 22.

In the four lighting device units 20, the projection lenses 22 are supported by the unit holder 16, and the light sources 24 are supported via the respective substrates 26 by a common holder plate 28. The holder plate 28 is formed so as to laterally extend in a strip like manner, and is supported in the peripheral portion by the unit holder 16.

The projection lens 22 of each lighting device unit 20 is formed by a planoconvex lens in which the front surface is convex and the rear surface is flat. The focal length f1 of the lens is set to a relatively small value. In each of the lighting device units 20, the light source 24 is placed in a position which is on the rear focal plane of the projection lens 22 and slightly deviated from the optical axis Ax.

As shown in FIG. 3, the light source 24 of each lighting device unit 20 has a rectangular light emitting chip 24a, and is placed so that the upper and lower sides of the light emitting chip 24a horizontally elongate. The specific shape of the light emitting chip 24a is set to a rectangular shape which extends relatively in the horizontal direction. As shown in FIG. 3, each of the light sources 24 is placed in a position which is deviated directly upward from the optical axis Ax in the front view of the lighting device, so that the light beams from the lighting device units 20 are formed as parallel beams which are directed slightly downward.

As described above, the diffusion lens elements 14s1 are formed in the lower region of the transparent cover 14. Therefore, the light beams from the lighting device units 20 which are forward emitted via the projection lenses 22 are horizontally diffused by the diffusion lens elements 14s1.

Figure 4:
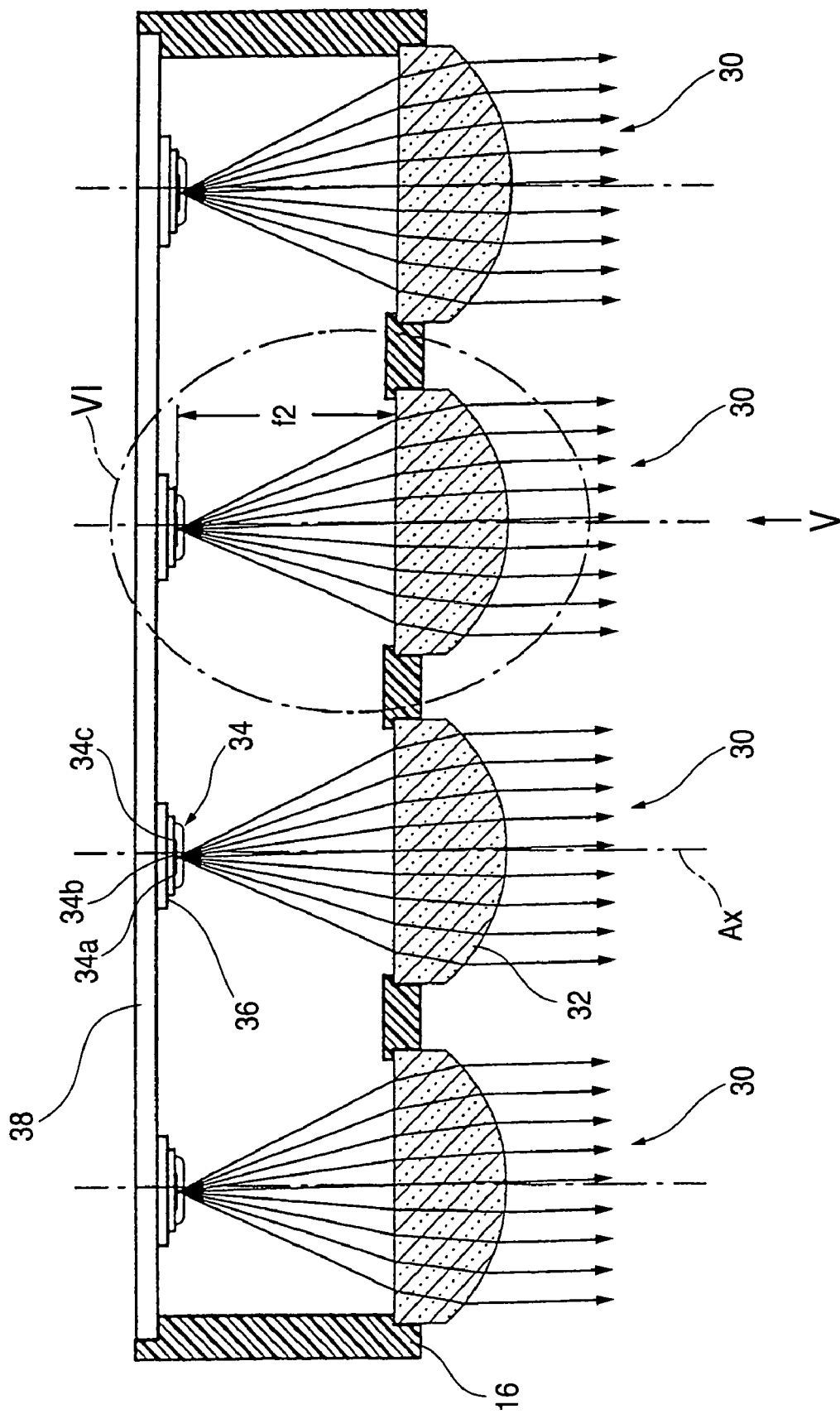
FIG. 4 is a section view taken along the line IV—IV of FIG. 1 according to the exemplary, non-limiting embodiment of the present invention.
Figure 5:
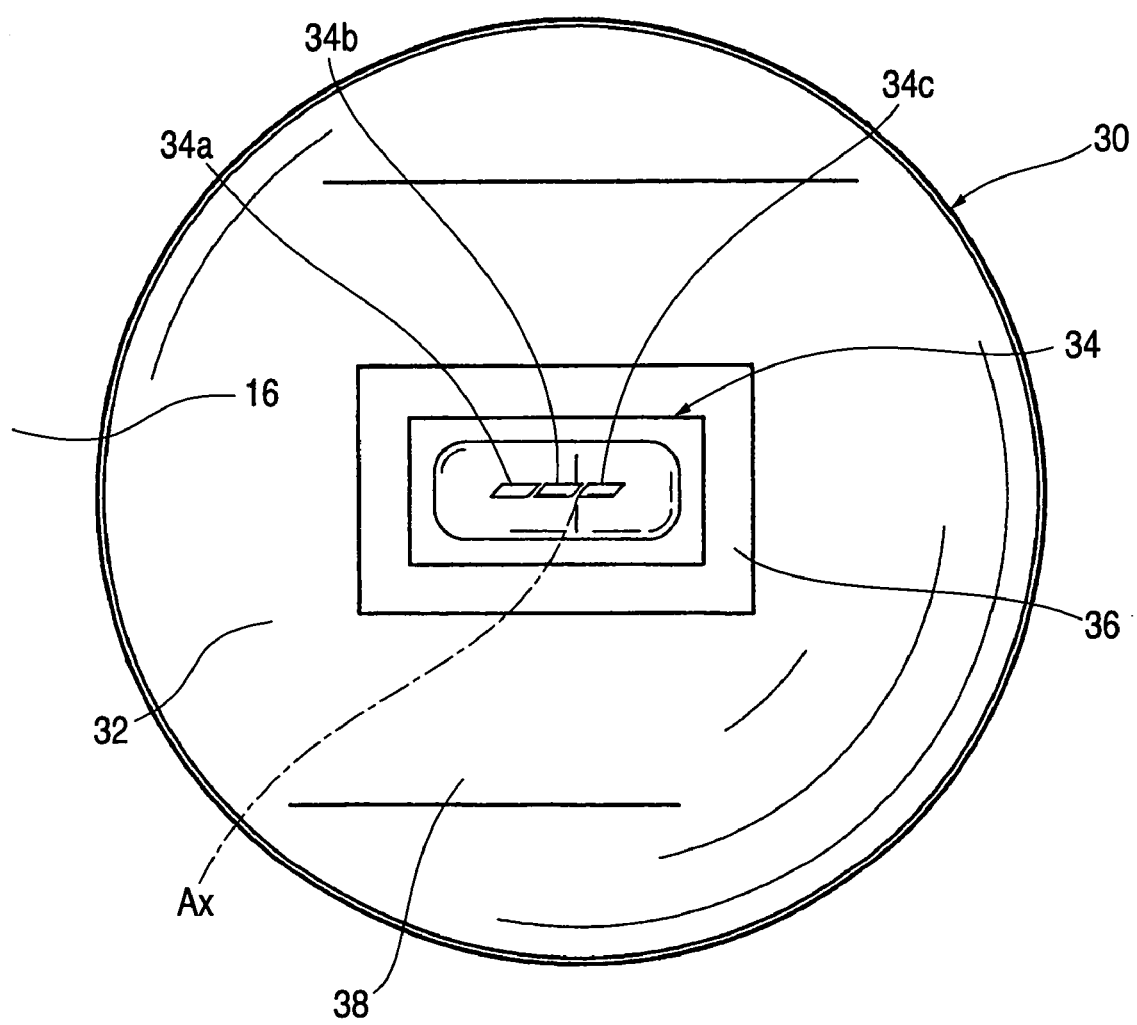
FIG. 5 is a detail view looking in the direction of the arrow V in FIG. 4 according to the exemplary, non-limiting embodiment of the present invention.
Figure 6:
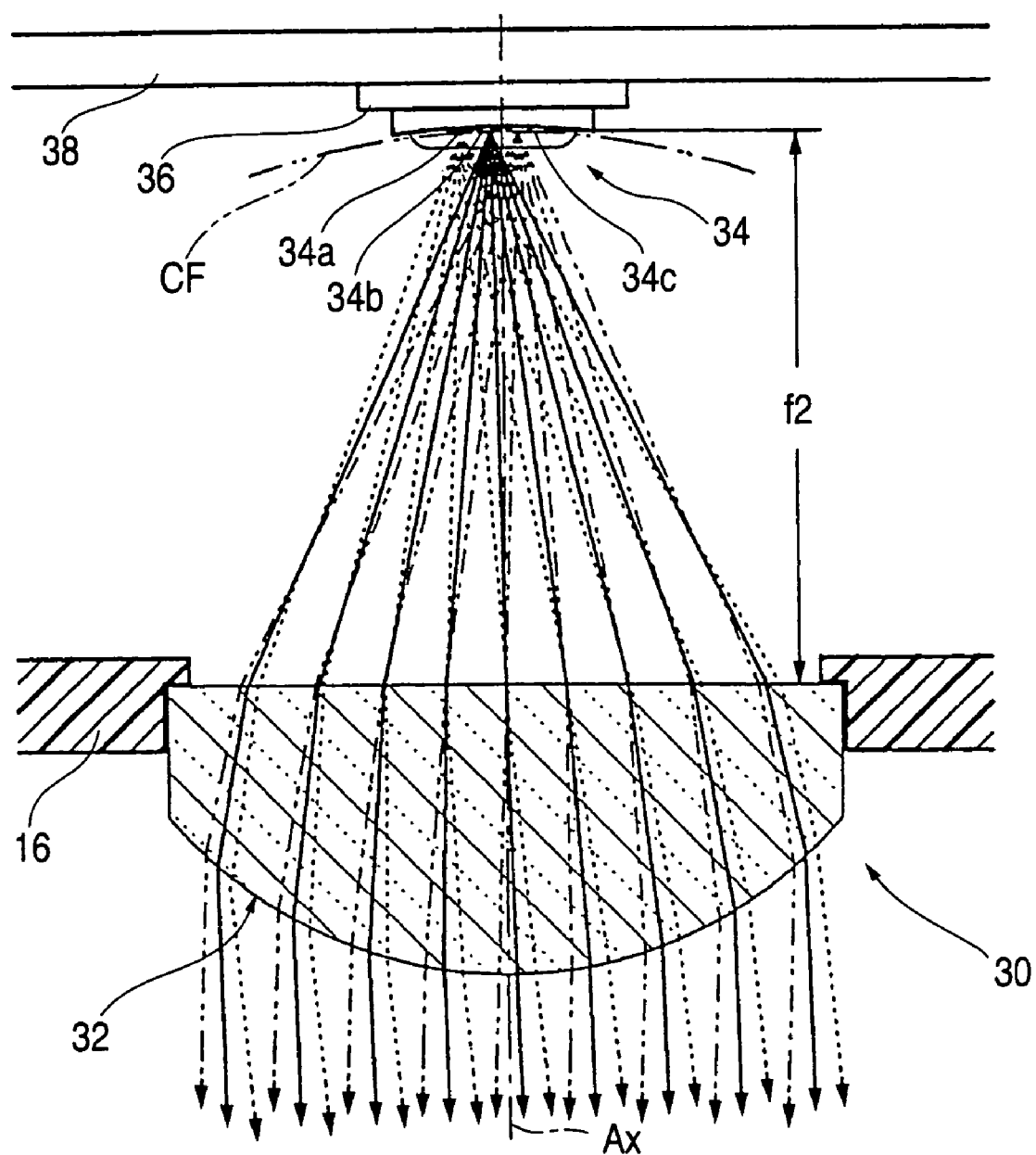
FIG. 6 is a detail view of the portion VI of FIG. 4 according to the exemplary, non-limiting embodiment of the present invention.

FIG. 4 is a section view taken along the line IV—IV of FIG. 1, FIG. 5 is a detail view looking in the direction of the arrow V in FIG. 4, and FIG. 6 is a detail view of the portion VI of FIG. 4. Each of the lighting device units 30 in the middle row comprises: a projection lens 32 which is placed on an optical axis Ax elongating in the longitudinal direction of the vehicle; a light source 34 configured by a light emitting diode which is forward directed in the vicinity of the rear focal point of the projection lens 32; and a substrate 36 to which the light source 34 is attached. The lighting device units 30 project images of their light sources 34 as inverted images toward the front of the lighting devices by means of the projection lenses 32.

In the four lighting device units 30, the projection lenses 32 are supported by the unit holder 16, and the light sources 34 are supported via the respective substrates 36 by a common holder plate 38. The holder plate 38 is formed so as to laterally extend in a strip like manner, and supported in the peripheral portion by the unit holder 16.

The projection lens 32 of each lighting device unit 30 is formed by a planoconvex lens in which the front surface is convex and the rear surface is flat. The focal length f2 of the lens is set to a relatively large value. In each of the lighting device units 30, the light source 34 is placed in a position which is on the rear focal plane of the projection lens 32 and slightly deviated from the optical axis Ax.

As shown in FIGS. 5 and 6, the light source 34 of each lighting device unit 30 has three light emitting chips 34a, 34b, 34c. The light emitting chips 34a, 34b, 34c have the same shape and size, and are arranged in a horizontal row with a minute interval therebetween. The shape of each of the light emitting chips 34a, 34b, 34c is set to a laterally elongated parallelogram shape in which the right and left oblique sides are inclined with respect to the upper and lower sides by about 45° in the right upward direction in the front view of the lighting device. The light emitting chips are arranged such that their upper and lower sides are vertically aligned with one another.

The three light emitting chips 34a, 34b, 34c are placed slightly above the optical axis Ax so that the right oblique side of the middle light emitting chip 34b passes the optical axis Ax. According to the configuration, the lighting device units 30 emit light beams in the following manner. When the light emitting chip 34b is turned ON, parallel beams which are slightly leftward and downward directed are formed as indicated by the solid lines in FIG. 6.

When the light emitting chip 34a is turned ON, parallel beams which are more slightly leftward directed than the beams in the case where the light emitting chip 34b is turned ON are formed as indicated by the broken lines in FIG. 6. When the light emitting chip 34c is turned ON, parallel beams which are more slightly rightward directed than the beams in the case where the light emitting chip 34b is turned ON are formed as indicated by the two-dot chain lines in FIG. 6.

As indicated by the two-dot chain line CF in FIG. 6, a horizontal section of the rear focal plane of the projection lens 32 is formed as an approximately arcuate shape because of the field curvature of the projection lens 32. In order to correspond to the field curvature, therefore, the light emitting chips 34a, 34b, 34c of the light source 34 are arranged along the horizontal section shape CF of the rear focal plane.

Figure 7:
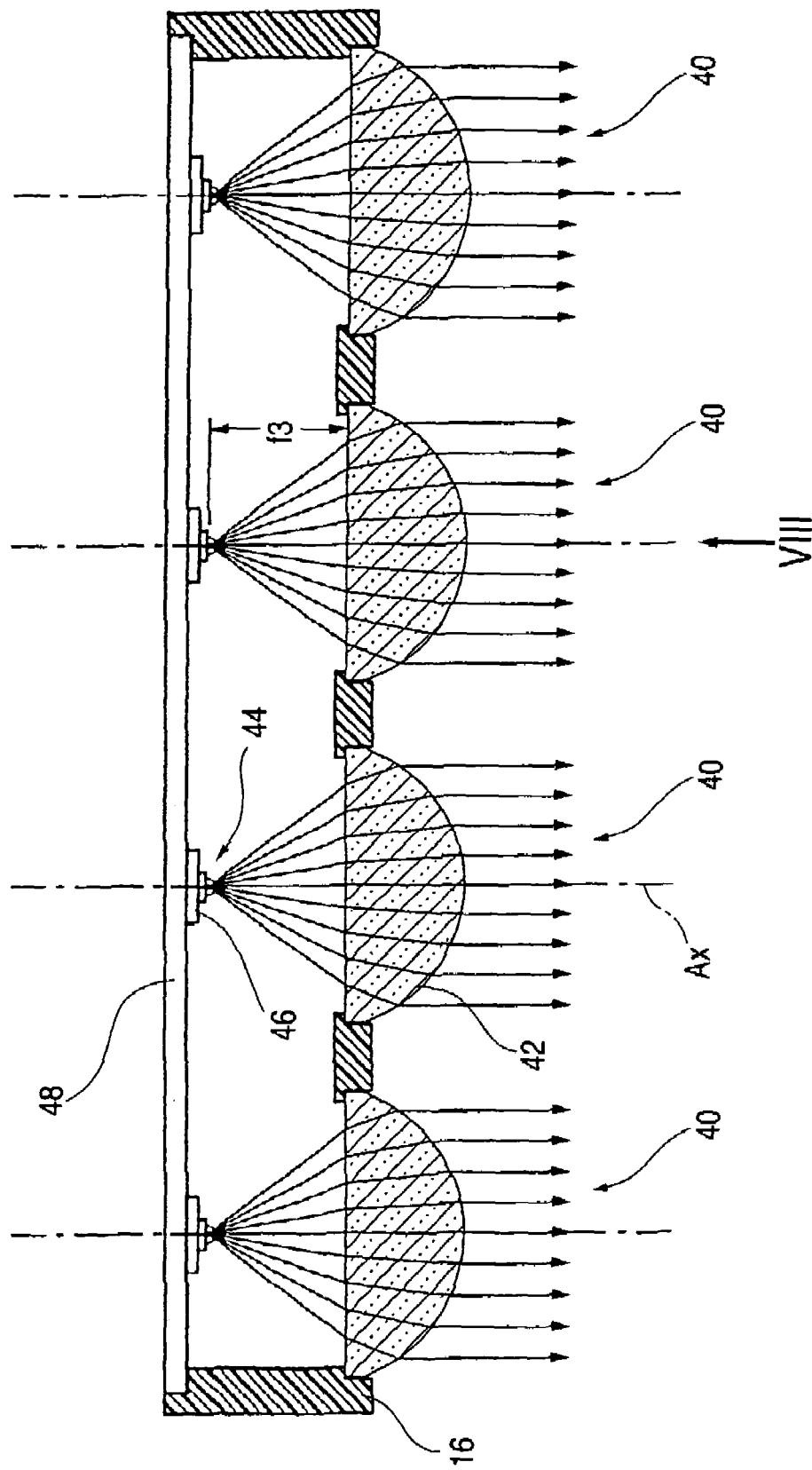
FIG. 7 is a section view taken along the line VII—VII of FIG. 1 according to the exemplary, non-limiting embodiment of the present invention.
Figure 8:
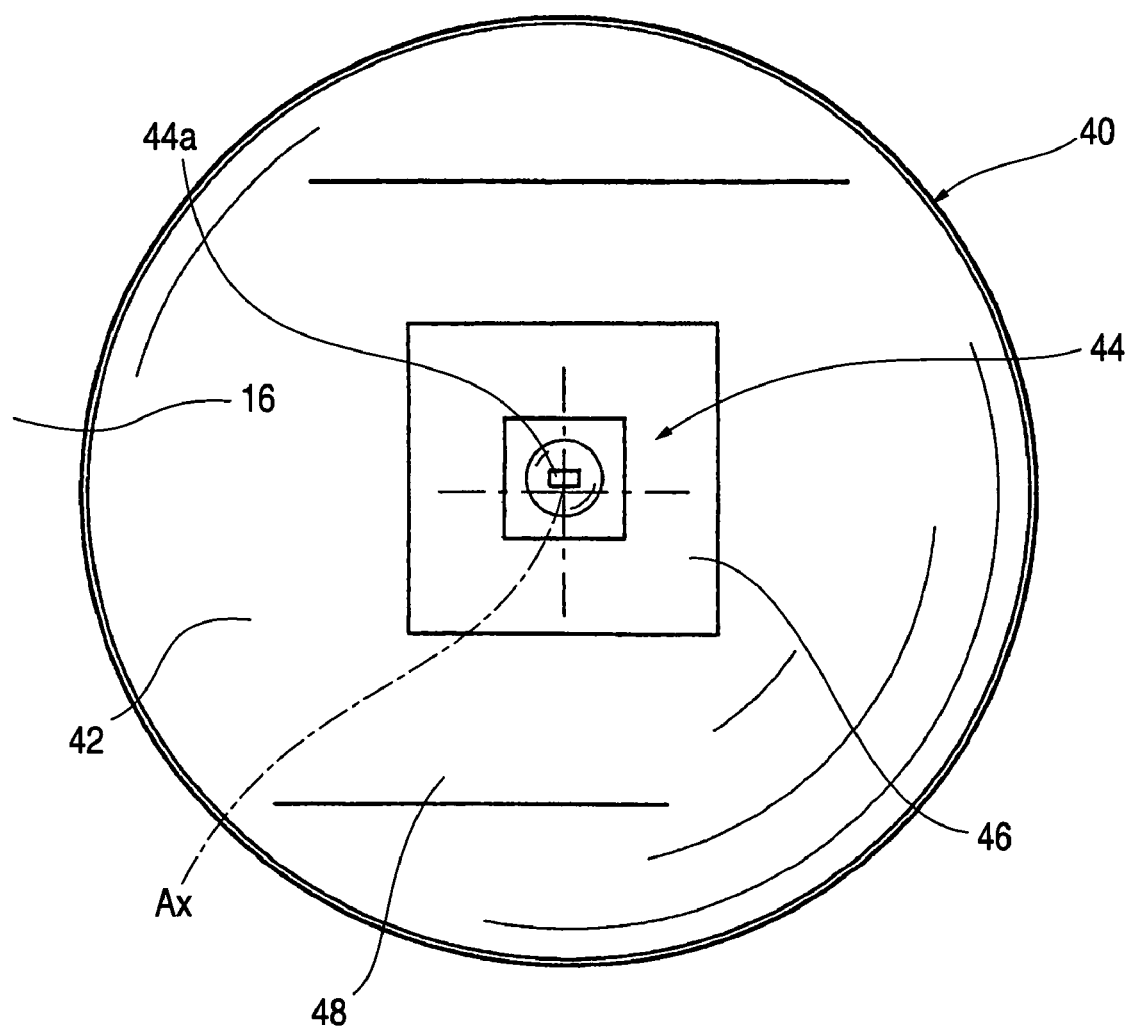
FIG. 8 is a detail view looking in the direction of the arrow VIII in FIG. 7 according to the exemplary, non-limiting embodiment of the present invention.

FIG. 7 is a section view taken along the line VII—VII of FIG. 1, and FIG. 8 is a detail view looking in the direction of the arrow VIII in FIG. 7. Each of the lighting device units 40 in the upper row comprises: a projection lens 42 placed on the optical axis Ax elongating in the longitudinal direction of the vehicle; a light source 44 configured by a light emitting diode forward directed in the vicinity of the rear focal point of the projection lens 42; and a substrate 46 to which the light source 44 is attached. The lighting device units 40 project images of their light sources 44 as inverted images toward the front of the lighting devices by means of the projection lenses 42.

In the four lighting device units 40, the projection lenses 42 are supported by the unit holder 16, and the light sources 44 are supported via the respective substrates 46 by a common holder plate 48. The holder plate 48 is formed to laterally extend in a strip like manner, and supported in the peripheral portion by the unit holder 16.

The projection lens 42 of each lighting device unit 40 is formed by a planoconvex lens in which the front surface is convex and the rear surface is flat. The focal length f3 of the lens is set to a relatively small value. In each of the lighting device units 40, the light source 44 is placed in a position which is slightly rearward deviated from the rear focal point of the projection lens 42.

As shown in FIG. 8, the light source 44 of each lighting device unit 40 has a rectangular light emitting chip 44a, and is placed so that the upper and lower sides of the light emitting chip 44a horizontally elongate. The specific shape of the light emitting chip 44a is set to a rectangular shape which extends relatively in the horizontal direction. As shown in FIG. 8, the light source 44 of each lighting device unit 40 is placed in a position which is deviated directly upward from the optical axis Ax in the front view of the lighting device unit, so that the light beams from the lighting device units 40 are formed as approximately parallel beams which are slightly downward directed and converged.

As described above, the diffusion lens elements 14s3 are formed in the upper region of the transparent cover 14. Therefore, the light beams from the light sources 44 which are forward emitted via the projection lenses 42 are horizontally diffused by the diffusion lens elements 14s3.

Figure 9:
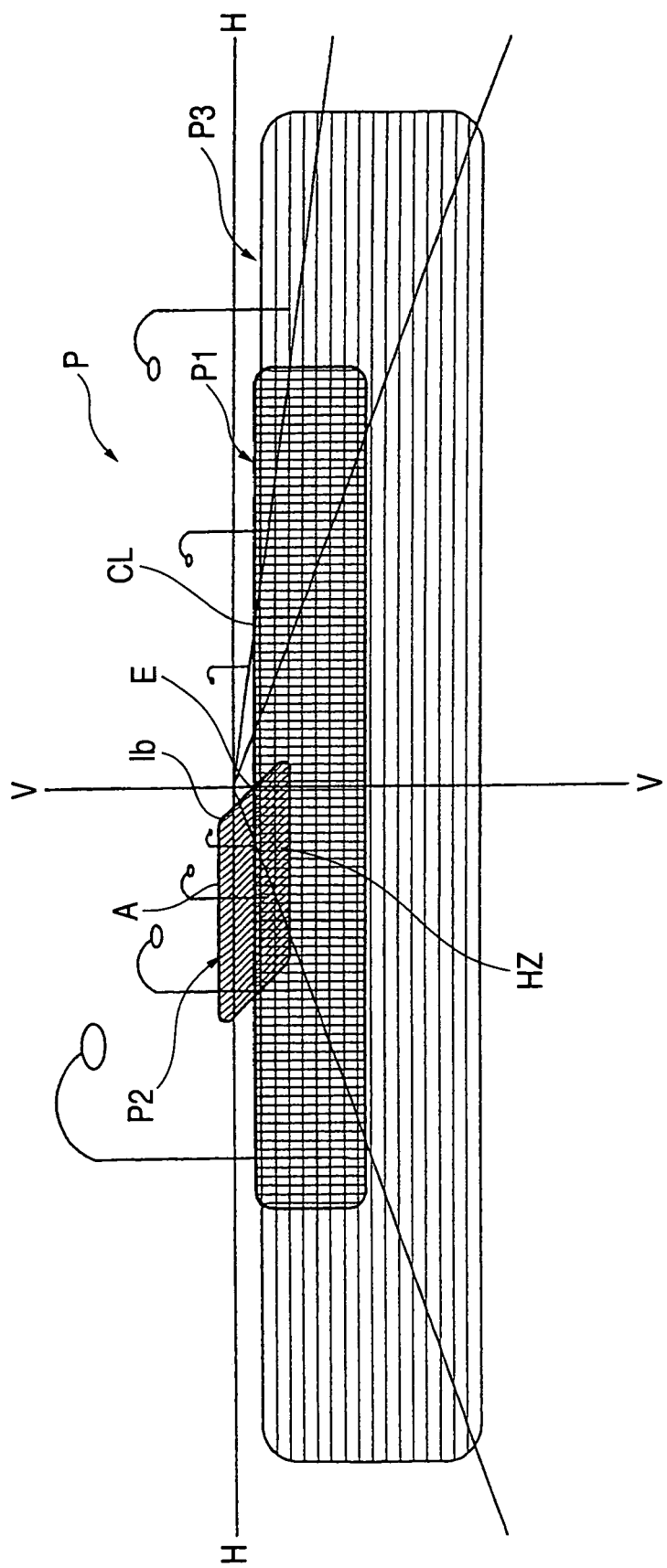
FIG. 9 is a view showing a luminous distribution pattern formed by the exemplary, non-limiting embodiment of the present invention on a virtual vertical screen placed 25 meters ahead of the lighting device by light beams forward emitted by the vehicle head lamp when a vehicle advances straight forward.
Figure 10:
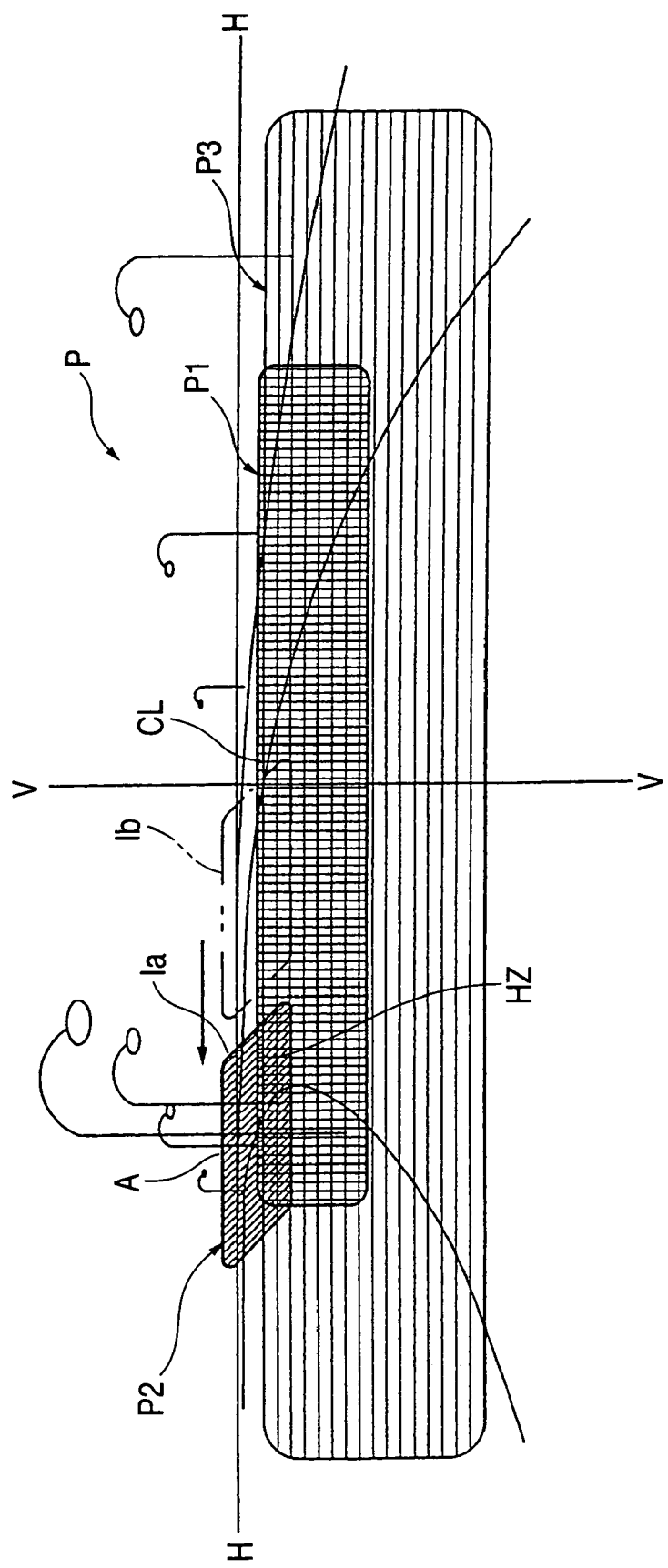
FIG. 10 is a view showing a luminous distribution pattern formed by the exemplary, non-limiting embodiment of the present invention on the virtual vertical screen by light beams forward emitted by the vehicle head lamp when the vehicle turns leftward.
Figure 11:
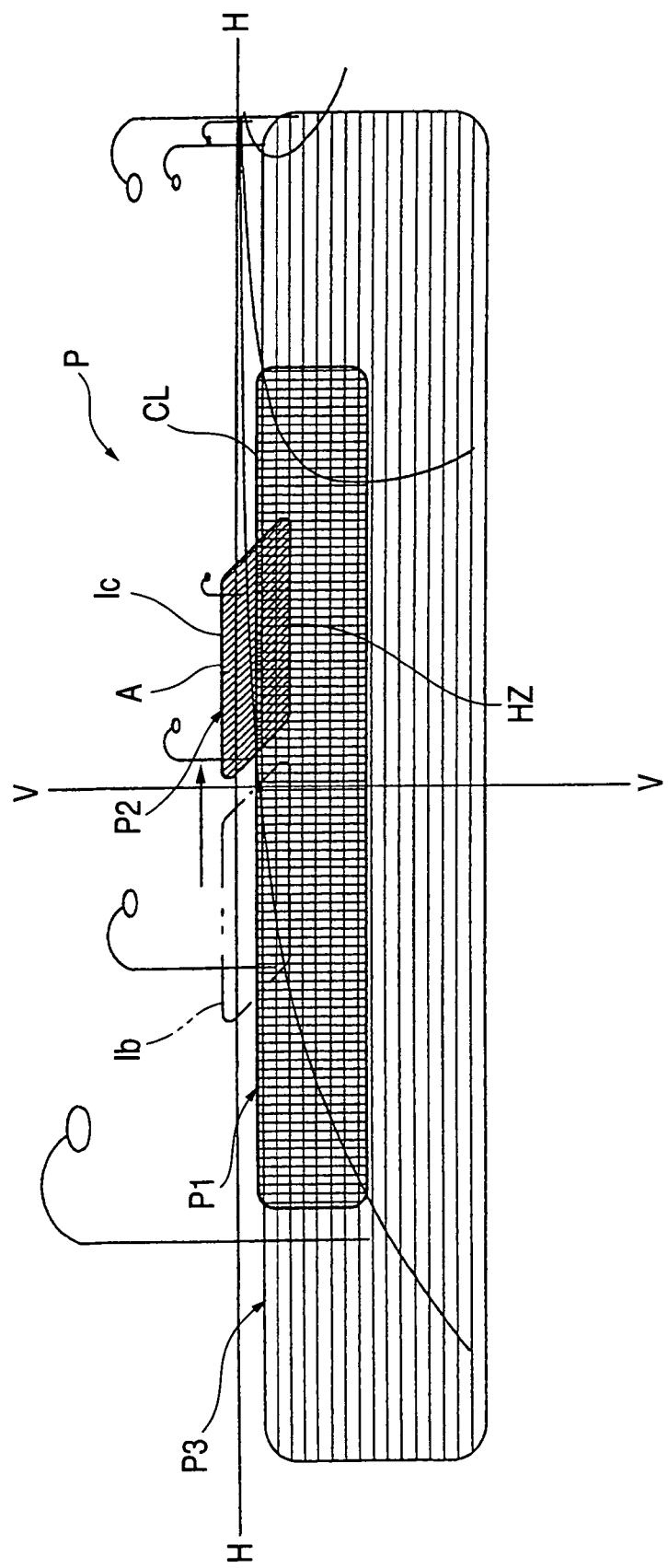
FIG. 11 is a view showing a luminous distribution pattern formed by the exemplary, non-limiting embodiment of the present invention on the virtual vertical screen by light beams forward emitted by the vehicle head lamp when the vehicle turns rightward.

FIGS. 9 to 11 are views showing in a transparent manner a luminous distribution pattern P which is formed on a virtual vertical screen placed 25 meters ahead of the lighting device by light beams that are forward emitted by the vehicle head lamp 10 of the embodiment. FIG. 9 shows a luminous distribution pattern which is formed when the vehicle straight forward advances, FIG. 10 shows that which is formed when the vehicle turns leftward, and FIG. 11 shows that which is formed when the vehicle turns rightward.

As shown in FIGS. 9–11, the luminous distribution pattern P is a leftward low-beam luminous distribution pattern having: a horizontal cutoff line CL in an upper end portion; and an upward protrusion A that upward protrudes from the horizontal cutoff line CL, and formed as a synthetic luminous distribution pattern of a horizontal cutoff line forming pattern P1, an upward protrusion forming pattern P2, and a diffusion region forming pattern P3.

As described later, the upward protrusion forming pattern P2 is formed as a luminous distribution pattern having an approximate parallelogram shape in which the upper and lower edges horizontally elongate and the right and left edges are inclined in the left upward direction by 45°. According to the configuration, the right edge of the upward protrusion A is raised by about 45° from the horizontal cutoff line CL.

In the low-beam luminous distribution pattern P, as shown in FIG. 9, an elbow point E which is an intersection of the horizontal cutoff line CL and the right edge of the upward protrusion A is set to a position which is lower by about 0.5 to 0.6° than the H-V which is a vanishing point of the front direction of the lighting device when the vehicle straight forward advances. A hot zone HZ which is a highly bright zone is formed in the vicinity of the lower left side of the elbow point E.

The horizontal cutoff line forming pattern P1 is a luminous distribution pattern for forming the horizontal cutoff line CL, and formed by illumination from the four lighting device units 20.

The horizontal cutoff line forming pattern P1 is formed by horizontally diffusing the inverted images of the light sources 24 of the four lighting device units 20 which are forward projected through the projection lenses 22, by the diffusion lens elements 14s1 that are formed in the lower region of the transparent cover 14.

In each of the lighting device units 20, the focal length f1 of the projection lens 22 is set to a relatively small value, and the light source 24 is placed in a position which is directly above the rear focal point of the projection lens 22. Therefore, the corresponding inverted image is formed as a slightly large image having a laterally elongated rectangular shape in a position lower than the H-V. These inverted images are horizontally diffused by the diffusion lens elements 14s1, whereby the horizontal cutoff line CL is formed.

The upward protrusion forming pattern P2 is a luminous distribution pattern for forming the upward protrusion A, and formed by illumination from the four lighting device units 30.

The upward protrusion forming pattern P2 is formed by superimposing one another the inverted images of the light sources 34 which are forward projected through the projection lenses 32 in the four lighting device units 30. Specifically, in the light source 34 of each of the lighting device units 30, when the vehicle straight forward advances, the light emitting chip 34b which is positioned in the middle emits light to form an inverted image Ib; when the vehicle turns leftward, the light emitting chip 34a which is positioned in the left side in the front view of the lighting device emits light to form an inverted image Ia; and, when the vehicle turns rightward, the light emitting chip 34c which is positioned in the right side in the front view of the lighting device emits light to form an inverted image Ic.

In each of the lighting device units 30, the focal length f2 of the projection lens 32 is set to a relatively large value, and the light source 34 is on the rear focal plane of the projection lens 32. Therefore, the inverted images Ia, Ib, Ic are formed as bright images which are relatively small.

In each of the light sources 34, the light emitting chip 34b which is positioned in the middle is placed so that the right oblique side in the front view of the lighting device passes the optical axis Ax. As shown in FIG. 9, therefore, the upward protrusion forming pattern P2 formed by the inverted image Ib when the vehicle straight forward advances is a luminous distribution pattern having an approximate parallelogram shape in which the upper and lower edges horizontally elongate and the right edge is inclined in the left upward direction by about 45° in the vicinity of the H-V.

In the upward protrusion forming pattern P2, the portion which is above the horizontal cutoff line CL forms the upward protrusion A, and the lower portion overlaps with the horizontal cutoff line forming pattern P1 to form the hot zone HZ. When the vehicle straight forward advances, the remote visibility of the road surface positioned in front of the vehicle is ensured by the upward protrusion forming pattern P2.

In each of the light sources 34, the light emitting chip 34a which is turned ON when the vehicle turns leftward is positioned on the left side of the light emitting chip 34b in the front view of the lighting device. As shown in FIG. 10, therefore, the upward protrusion forming pattern P2 which is formed by the inverted image Ia when the vehicle turns leftward is formed in a position which is leftward moved with respect to the position of the case of the straight forward advance of the vehicle that is indicated by the two-dot chain lines in FIG. 10. As a result, also the upward protrusion A and the hot zone HZ are leftward displaced. When the vehicle turns leftward, the remote visibility of the road surface positioned in front of the vehicle is ensured by the upward protrusion forming pattern P2.

By contrast, in each of the light sources 34, the light emitting chip 34c which is turned ON when the vehicle turns rightward is positioned on the right side of the light emitting chip 34b in the front view of the lighting device. As shown in FIG. 11, therefore, the upward protrusion forming pattern P2 which is formed by the inverted image Ic when the vehicle turns rightward is formed in a position which is rightward moved with respect to the position of the case of the straight forward advance of the vehicle that is indicated by the two-dot chain lines in FIG. 11. As a result, the upward protrusion A and the hot zone HZ are rightward displaced. When the vehicle turns rightward, the remote visibility of the road surface positioned in front of the vehicle is ensured by the upward protrusion forming pattern P2.

The diffusion region forming pattern P3 is a luminous distribution pattern for forming a diffusion region of the luminous distribution pattern P, and formed as a luminous distribution pattern which is considerably larger than the cutoff line forming pattern P1, below the horizontal cutoff line CL by illumination from the four lighting device units 40.

The diffusion region forming pattern P3 is formed by horizontally diffusing the inverted images of the light sources 44 of the four lighting device units 40 which are forward projected through the projection lenses 42, by the diffusion lens elements 14s3 that are formed in the upper region of the transparent cover 14.

In each of the lighting device units 40, the focal length f3 of the projection lens 42 is set to a relatively small value, and the light source 44 is placed in a position which is in rear of the rear focal point of the projection lens 42. Therefore, the corresponding inverted image is formed as a large image having a slightly blurred outline. These inverted images are horizontally diffused by the diffusion lens elements 14s3, and hence the resulting diffusion region forming pattern P3 is substantially free from uneven illumination. As a result, the road surface positioned in front of the vehicle is evenly illuminated in a wide range.

As described above in detail, the vehicle head lamp 10 of the embodiment is configured so as to from the low-beam luminous distribution pattern P having: the horizontal cutoff line CL in the upper end portion; and the upward protrusion A that upward protrudes from the horizontal cutoff line CL, and comprises the four lighting device units 30 which conduct illumination for forming the upward protrusion A. Each of lighting device units 30 comprises: the light source 34 configured by the light emitting diode which has the three light emitting chips 34a, 34b, 34c that are arranged in a row, and which is placed with being forward directed while the three light emitting chips 34a, 34b, 34c are horizontally arranged; and the projection lens 32 which is disposed in front of the light source 34, and which projects an image of the light source 34 toward the front of a lighting device, the image being an inverted image. Therefore, the head lamp can attain the following functions and effects.

In the embodiment, the upward protrusion forming pattern P2 a part of which is the upward protrusion A is formed by illumination from the four light emitting units 30. In the light source 34 of each of the light emitting units 30, the three light emitting chips 34a, 34b, 34c constituting the light source are placed with being forward directed in a state where the chips are horizontally arranged. Therefore, the inverted images of the light emitting chips 34a, 34b, 34c of the light source which are projected via the projection lenses 32 onto a virtual vertical screen in front of the lighting device are formed at positions that are horizontally shifted from one another.

The light emitting chip 34b is controlled so as to be turned ON when the vehicle straight forward advances, the light emitting chip 34a is controlled so as to be turned ON when the vehicle turns leftward, and the light emitting chip 34c is controlled so as to be turned ON when the vehicle turns rightward, whereby the position where the upward protrusion A is formed can be horizontally moved together with that where the hot zone HZ is formed. Consequently, the road surface in the traveling direction of the vehicle can be brightly illuminated, and the remote visibility can be enhanced not only during straight advancing of the vehicle but also during turning of the vehicle.

The present invention has various advantages, but need not have these advantages for the best mode to be properly enabled. For example, but not by way of limitation, since each of the lighting device units 30 comprises the light source 34 formed by the light emitting diodes, and the projection lens 32 disposed in front of the light source, the lighting device unit 30 can be configured in a simple and compact manner.

In the embodiment, particularly, each of the four lighting device units 20 which conduct illumination for forming the horizontal cutoff line forming pattern P1, and the four lighting device units 40 which conduct illumination for forming the diffusion region forming pattern P3 is configured so as to have the light source 24 or 44 formed by a light emitting diode, and the projection lens 22 or 42 which is disposed in front of the light source. Therefore, the whole of the vehicle head lamp 10 can be configured in a simple and compact manner.

In the embodiment, moreover, the three light emitting chips 34a, 34b, 34c are arranged on the focal plane of the projection lens 32. Although the projection lens 32 has a considerably large field curvature, therefore, the inverted images Ia, Ib, Ic which are projected onto a virtual vertical screen in front of the lighting device when the light emitting chips 34a, 34b, 34c emit light can be formed as images of a clear outline. As a result, glare light can be effectively prevented from being produced.

In the embodiment, the light emitting chips 34a, 34b, 34c have a parallelogram shape. Therefore, the inverted images Ia, Ib, Ic of the light source 34 projected onto the virtual vertical screen can be formed so that their side edges are obliquely raised from the horizontal cutoff line CL while their lower edges are set to be substantially horizontal. When the lower edges of the inverted images Ia, Ib, Ic are substantially horizontal, the road surface in front of the vehicle can be effectively prevented from being unevenly illuminated. Since the side edges of the inverted images Ia, Ib, Ic are obliquely raised from the horizontal cutoff line CL, the remote visibility of the driver of the present vehicle can be further enhanced without forming glare light for the driver of an oncoming vehicle.

The embodiment comprises the four lighting device units 30 which conduct illumination for forming the upward protrusion A. Therefore, the upward protrusion A can be made, enough bright, so that the road surface in the traveling direction of the vehicle can be sufficiently brightly illuminated.

Figure 12:
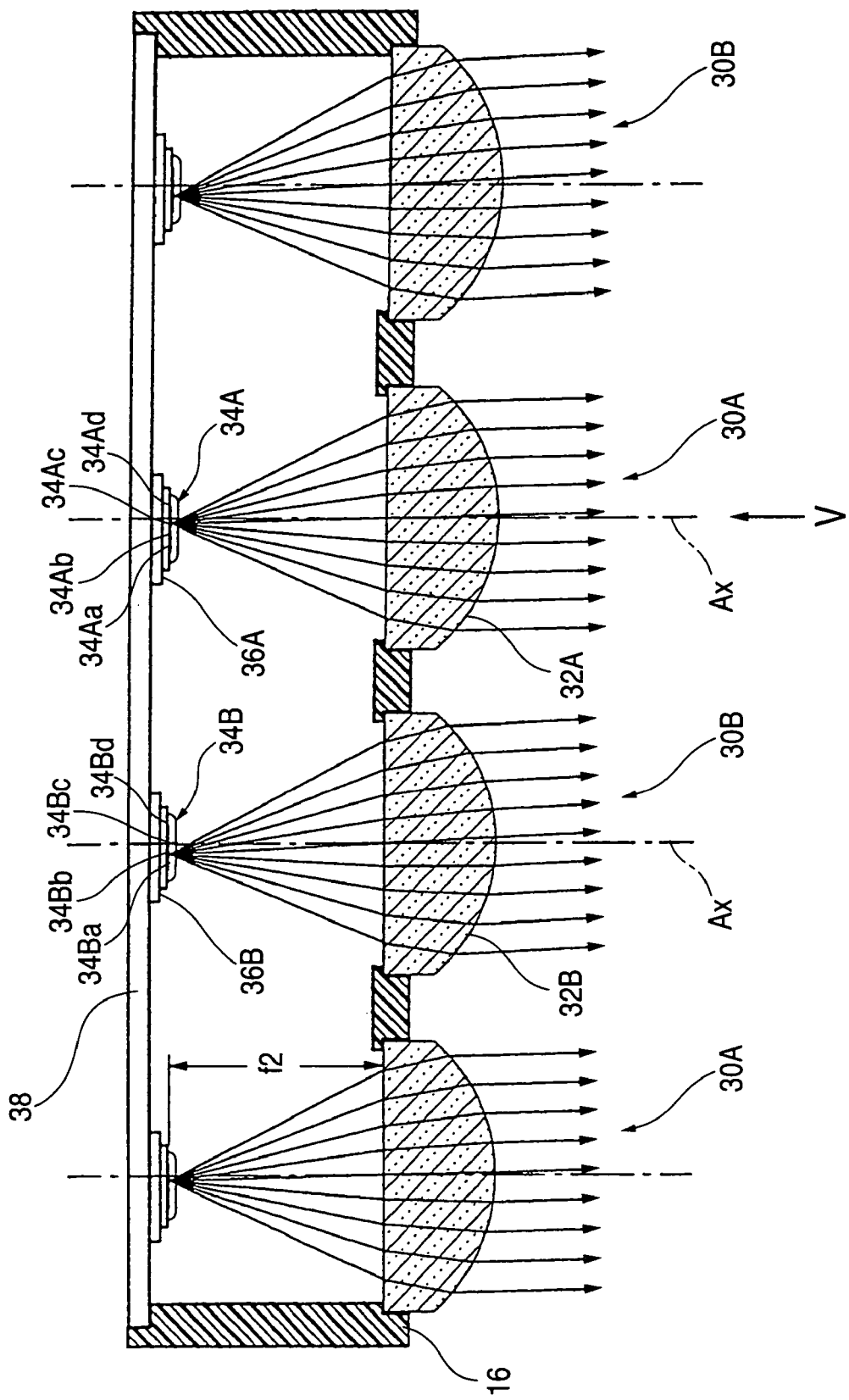
FIG. 12 is a view showing main portions of a vehicle head lamp of a first exemplary, non-limiting modification of the exemplary, non-limiting embodiment of the present invention, and similar to FIG. 2.

Next, modifications of the embodiment will be described. FIG. 12 is a view showing main portions of a vehicle head lamp of the modification, and similar to FIG. 2. The basic configuration of the lighting device in the modification is identical with that of the aforementioned exemplary, non-limiting embodiment. However, the modification is different from the embodiment in that four lighting device units 30A, 30B are disposed in place of the four lighting device units 30.

In each of the lighting device units 30A, 30B, a projection lens 32A or 32B which is strictly identical with the projection lenses 32 of the embodiment is placed on an optical axis Ax elongating in the longitudinal direction of the vehicle, and a light source 34A or 34B configured by a light emitting diode is placed with being forward directed in the vicinity of the rear focal point of the projection lens 32A or 32B. The lighting device units 30A, 30B project images of their light sources 34A, 34B as inverted images toward the front of the lighting device by means of the projection lenses 32A, 32B.

In each of the lighting device units 30A, the light source 34A has four light emitting chips 34Aa, 34Ab, 34Ac, 34Ad. By contrast, in each of the lighting device units 30B, the light source 34B has four light emitting chips 34Ba, 34Bb, 34Bc, 34Bd.

Figure 13:
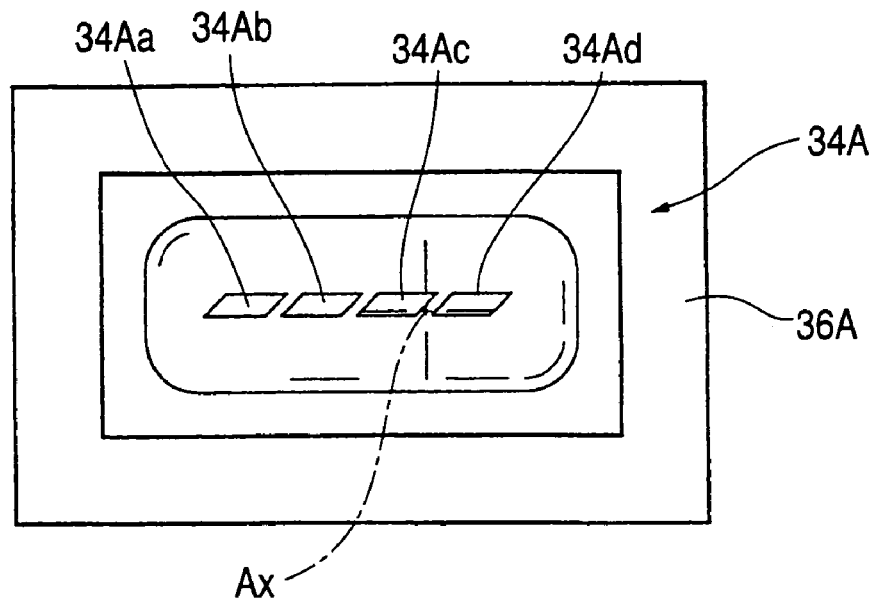
FIG. 13 is a front view showing in detail a light source of a lighting device unit in the exemplary, non-limiting modification according to the exemplary, non-limiting embodiment of the present invention.
Figure 13:
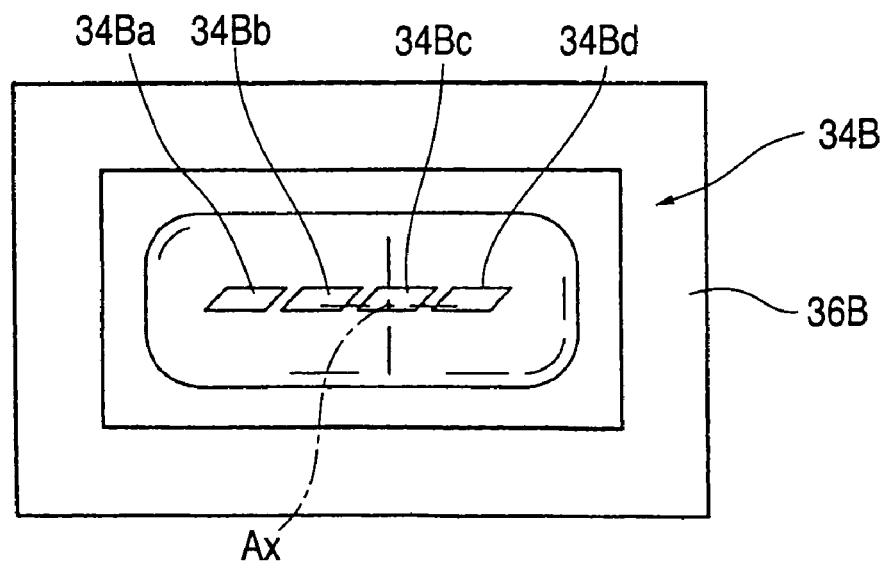

FIG. 13A is a front view showing in detail the light source 34A, and FIG. 13B is a front view showing in detail the light source 34B. The light emitting chips 34Aa, 34Ab, 34Ac, 34Ad constituting the light source 34A have the same shape and size, and are arranged in a horizontal row with forming a minute interval therebetween. The shape of each of the light emitting chips 34Aa, 34Ab, 34Ac, 34Ad is set to a laterally elongated parallelogram shape in which the pair of oblique sides are inclined with respect to the upper and lower sides by about 45° in the right upward direction in the front view of the lighting device. The light emitting chips are arranged in such a manner that their upper and lower sides are aligned in vertical position with one another.

The four light emitting chips 34Aa, 34Ab, 34Ac, 34Ad are placed slightly above the optical axis Ax so that the right oblique side of the light emitting chip 34Ac which is located at the second right position in the front view of the lighting device passes the optical axis Ax.

According to the configuration, the lighting device units 30A emit light beams in the following manner. When the light emitting chip 34Ac is turned ON, parallel beams which are slightly leftward and downward directed are formed in the same manner as the case where the light emitting chip 34b is turned ON in the embodiment. When the light emitting chip 34Ab is turned ON, parallel beams which are more slightly leftward directed than the beams in the case where the light emitting chip 34Ac is turned ON are formed. When the light emitting chip 34Aa is turned ON, parallel beams which are more slightly leftward directed than the beams in the case where the light emitting chip 34Ab is turned ON are formed. When the light emitting chip 34Ad is turned ON, parallel beams which are more slightly rightward directed than the beams in the case where the light emitting chip 34Ac is turned ON are formed.

By contrast, although the configuration of the light source 34B is strictly identical with that of the light source 34A, the position of the light source 34B with respect to the optical axis Ax is rightward shifted from the light source 34A in the front view of the lighting device. The shifting amount is set so that the light emitting chips 34Ba, 34Bb, 34Bc, 34Bd are shifted by a half pitch from the four light emitting chips 34Aa, 34Ab, 34Ac, 34Ad.

Figure 14:
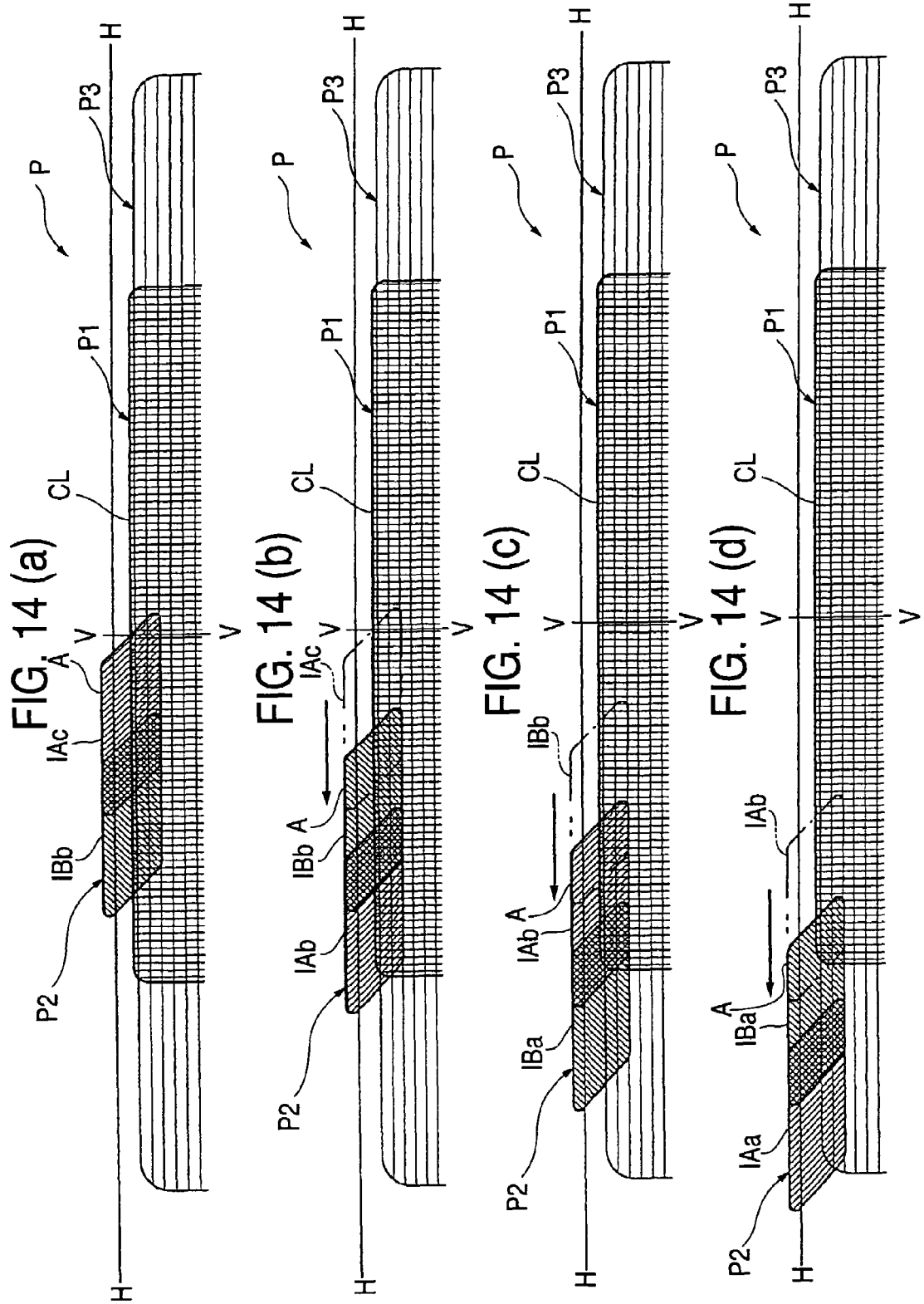
FIG. 14 is a view showing main portions of a luminous distribution pattern formed on the virtual vertical screen by light beams forward emitted by the vehicle head lamp of the modification, in transition from straight advancing of the vehicle to leftward turning of the vehicle, according to the exemplary, non-limiting embodiment of the present invention.
Figure 15:
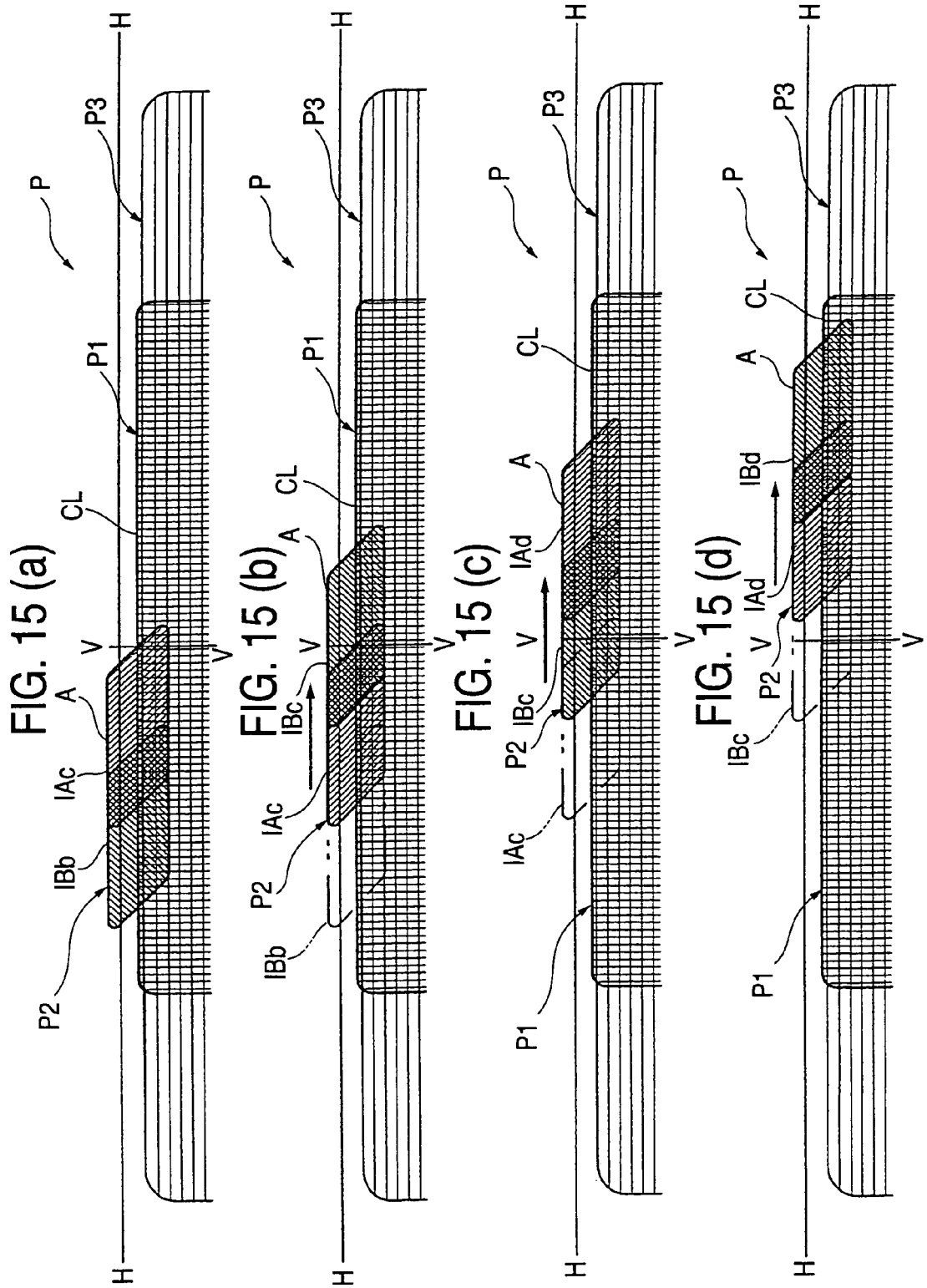
FIG. 15 is a view showing main portions of a luminous distribution pattern formed on the virtual vertical screen by light beams forward emitted by the vehicle head lamp of the modification, in transition from straight advancing of the vehicle to rightward turning of the vehicle, according to the exemplary, non-limiting embodiment of the present invention.

FIGS. 14 and 15 are views showing main portions of a luminous distribution pattern P formed on a virtual vertical screen placed 25 meters ahead of the lamp by light beams that are forward emitted by the vehicle head lamp of the modification. FIG. 14 shows luminous distribution patterns formed in transition from straight advancing of the vehicle to leftward turning of the vehicle, and FIG. 15 shows luminous distribution patterns formed in transition from straight advancing of the vehicle to leftward turning of the vehicle.

As shown in (a) of FIG. 14, when the vehicle straight forward advances, the light emitting chips 34Ac of the light sources 34A of the lighting device units 30A are turned ON, and the light emitting chips 34Bb of the light sources 34B of the lighting device units 30B are turned ON, so that the upward protrusion forming pattern P2 is formed by their inverted images IAc, IBb. At this time, the upward protrusion forming pattern P2 is a luminous distribution pattern in which the two inverted images IAc formed by illumination from the two lighting device units 30A partly overlap with the two inverted images IBb formed by illumination from the two lighting device units 30B.

When the vehicle leftward turns, as shown in (b) of FIG. 14, the light emitting chips 34Ac of the light sources 34A are first turned OFF, so that their inverted images IAc disappear, and the light emitting chips 34Ab of the light sources 34A are turned ON, so that their inverted images IAb are formed. As shown in (c) of FIG. 14, then, the light emitting chips 34Bb of the light sources 34B are turned OFF, so that their inverted images IBb disappear, and the light emitting chips 34Ba of the light sources 34B are turned ON, so that their inverted images IBa are formed. As shown in (d) of FIG. 14, finally, the light emitting chips 34Ab of the light sources 34A are turned OFF, so that their inverted images IAb disappear, and the light emitting chips 34Aa of the light sources 34A are turned ON, so that their inverted images IAa are formed. As a result, the upward protrusion forming pattern P2 is sequentially leftward moved by the half pitch.

By contrast, when the vehicle rightward turns, in a state of straight advancing of the vehicle in which the light emitting chips 34Ac of the light sources 34A and the light emitting chips 34Bb of the light sources 34B are turned ON and the inverted images IAc, IBb are formed as shown in (a) of FIG. 15. As shown in (b) of FIG. 15, the light emitting chips 34Bb of the light sources 34B are first turned OFF, so that their inverted images IBb disappear, and the light emitting chips 34Bc of the light sources 34B are turned ON, so that their inverted images IBc are formed. As shown in (c) of FIG. 15, then, the light emitting chips 34Ac of the light sources 34A are turned OFF, so that their inverted images IAc disappear, and the light emitting chips 34Ad of the light sources 34A are turned ON, so that their inverted images IAd are formed. As shown in (d) of FIG. 15, finally, the light emitting chips 34Bc of the light sources 34B are turned OFF, so that their inverted images IBc disappear, and the light emitting chips 34Bd of the light sources 34B are turned ON, so that their inverted images IBd are formed. As a result, the upward protrusion forming pattern P2 is sequentially rightward moved by the half pitch.

As in the modification, the four lighting device units 30A, 30B for forming the upward protrusion forming pattern P2 are configured so that the four light emitting chips 34Aa, 34Ab, 34Ac, 34Ad constituting the light sources 34A of the two lighting device units 30A are arranged so as to be shifted by a half pitch from the four light emitting chips 34Ba, 34Bb, 34Bc, 34Bd constituting the light sources 34B of the two lighting device units 30B. According to the configuration, when the vehicle turns, the light emitting chips which are arranged so as to be shifted by a half pitch between the two kinds of lighting device units 30A, 30B are sequentially turned ON, so that the position where the upward protrusion A is formed can be gradually horizontally moved, whereby the possibility that a useless sense of discomfort due to switching of light emission of the light emitting chips arises in the driver of the present vehicle can be reduced.

In place of the configuration of the modification comprising the two kinds of lighting device units 30A, 30B in which the arrangement pitches of the light emitting chips are shifted from one another by approximately one half pitch, another configuration may be employed where three or more kinds of lighting device units in which the arrangement pitches of light emitting chips are shifted by a predetermined amount among the lighting device units are used.

In the other configuration, when the vehicle turns, the light emitting chips which are arranged so as to be shifted by the predetermined amount from one another are sequentially turned ON, so that the position where the upward protrusion is formed can be gradually horizontally moved, whereby the possibility that a useless sense of discomfort due to switching of light emission of the light emitting chips arises in the driver of the present vehicle can be further reduced.

Figure 16:
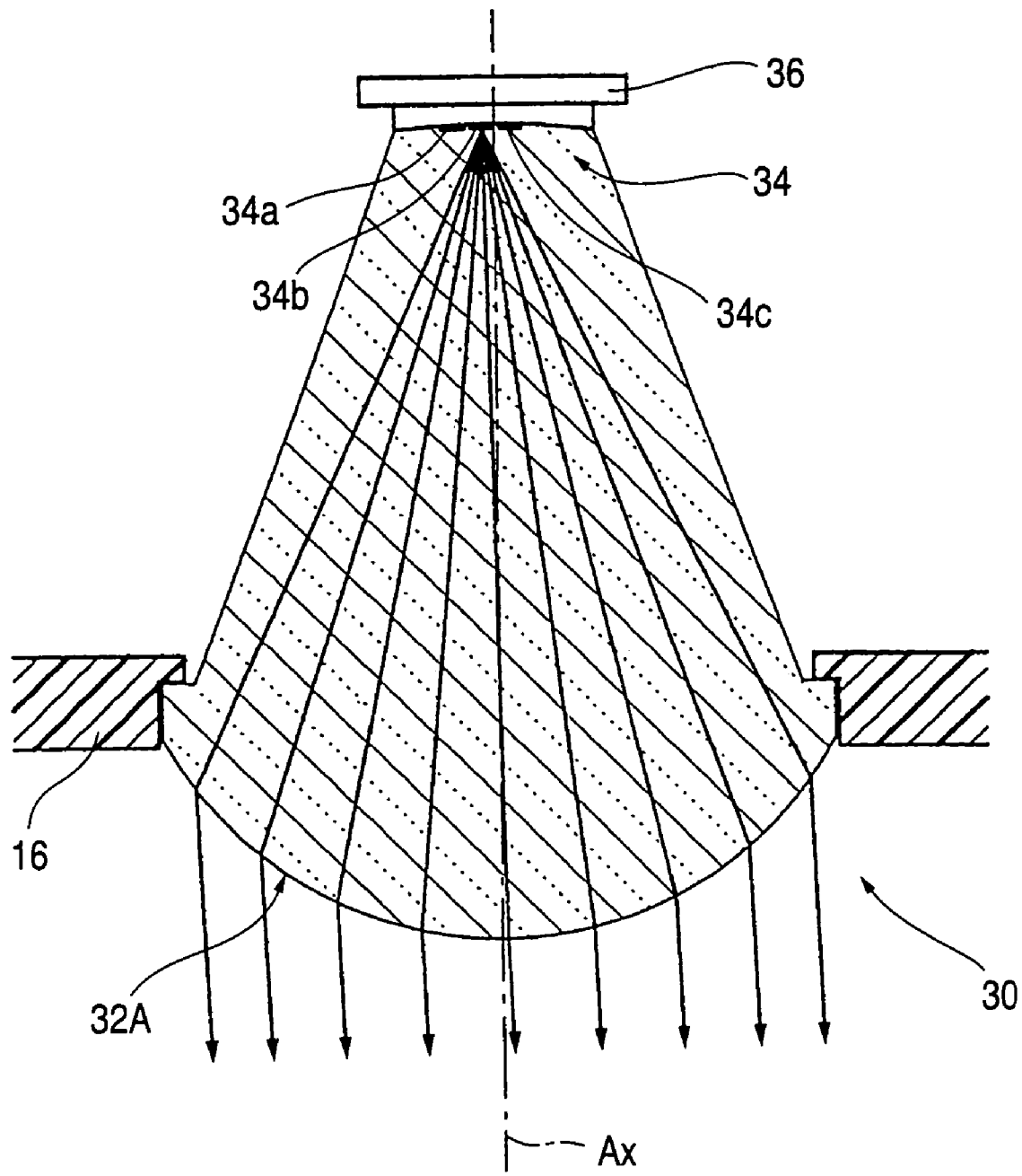
FIG. 16 is a view showing main portions of a vehicle head lamp of a second exemplary, non-limiting modification of the exemplary, non-limiting embodiment of the present invention, and similar to FIG. 6.

Next, a second modification of the embodiment will be described. FIG. 16 is a view showing main portions of a vehicle head lamp of the modification, and similar to FIG. 6.

The modification is different from the embodiment in that, in each of the lighting device units 30, the projection lens 32A is integrated with the light source 34 so as to hermetically seal the light emitting chips 34Aa, 34Ab, 34Ac of the light source 34.

According to the configuration, the lighting device units 30 can be formed as light source units so as to have a simpler configuration. Furthermore, it is possible to prevent an air layer from being interposed between the light source 34 and the projection lens 32A. Therefore, interface reflection can be eliminated, so that fluxes of the light source can be effectively used. According to the configuration, the holder plate 38 can be eliminated, so that the configuration of the vehicle head lamp can be further simplified.

Also the lighting device units 20, 40 can be configured in the same manner as the modification.

In the embodiment and modifications described above, the four lighting device units 20, the four lighting device units 30 or 30A, 30B, and four lighting device units 40 are placed in the three rows which are vertically arranged. It is a matter of course that the number and arrangement of the lighting device units may be adequately changed in accordance with the desired shape and distribution of the luminous distribution pattern.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

I claim:

1. A head lamp that forms a luminous distribution pattern having a horizontal cutoff line in an upper end portion and an protrusion that protrudes upward from said horizontal cutoff line, said lamp comprising:

at least one lighting device unit that conducts illumination for forming said upward protrusion, each of said lighting device units comprising,
a light source configured by a semiconductor light emitting device having a plurality of light emitting chips horizontally arranged in a row and being forward directed, and
a projection lens, disposed in front of said light source, that projects an inverted image of said light source toward a front of said head lamp.

2. A head lamp according to claim 1, wherein said light emitting chips are arranged on a focal plane of said projection lens.

3. A head lamp according to claim 1, wherein each of said light emitting chips has a substantially parallelogram shape.

4. A head lamp according to claim 1, wherein said at least one lighting device unit comprises a plurality of lighting device units, and wherein corresponding pitches of each of said light emitting chips are slightly different from one another by a predetermined amount.

5. A head lamp according to claim 1, wherein said projection lens is integrated with said light source to hermetically seal said plurality of light emitting chips of said light source.

6. A lamp that forms a luminous distribution pattern having a horizontal component and an upwardly extending oblique component, said lamp comprising:

a first lighting system horizontally positioned at a lower portion of said lamp and generating a first diffuse light;
a second lighting system horizontally positioned at an upper portion of said lamp and generating a second diffuse light; and
a third lighting system horizontally positioned at a middle portion of said lamp and generating a focused light that varies with the horizontal swinging of said lamp, said third lighting system including at least one lighting unit including,
a plurality of light emitting units each having a substantially parallelogram shape and horizontally positioned with respect to each other on an arcuate shaped plane, and
a projection lens having a shape corresponding to said arcuate projection plane, said projection lens projecting an image of said at least one lighting unit toward a front of said lamp to form said oblique component.

7. The lamp of claim 6, wherein a focal length of said third lighting system exceeds a focal length of said first lighting system and a focal length of said second lighting system, and at least one of said first and third light systems form said horizontal component.

8. The lamp of claim 6, wherein said plurality of light emitting units comprises three light emitting units such that (a) when said lamp is horizontally swung left, a first one of said light emitting units is transited to its ON position, (b) when said lamp is positioned substantially parallel with respect to a direction of travel, a second one of said light emitting units is transited to its ON position, and (c) when said lamp is horizontally swung right, a third one of said light emitting units is transited to its ON position.

9. The lamp of claim 8, wherein said second one of said light emitting units is positioned between said first and third ones of said light emitting units on said arcuate shaped plane, such that a right oblique side of said second one of said light emitting units passes through an optical axis of said at least one lighting unit.

10. The lamp of claim 6, wherein said first lighting system comprises:
  a first system light emitting unit positioned directly above an optical axis of said first lighting system; and
  a first system projection lens positioned along said optical axis a distance in front of said first system light emitting unit.

11. The lamp of claim 6, wherein said second lighting system comprises:
  a second system light emitting unit positioned directly above an optical axis of said second lighting system; and
  a second system projection lens positioned along said optical axis a distance in front of said second system light emitting unit.

12. The lamp of claim 6, wherein said plurality of light emitting units comprises four light emitting units such that (a) when said lamp is positioned substantially parallel with respect to a direction of travel, at least one central one of said light emitting units is transited to its ON position, (b) when said lamp is horizontally swung left, at least one of said light emitting units on a first side of said at least one central one of said light emitting units is transited to its ON position, and (c) when said lamp is horizontally swung right, at least one of said light emitting units on a second side of said at least one central one of said light emitting units is transited to its ON position.

13. The lamp of claim 12, wherein said at least one central one of said light emitting units is positioned on said arcuate shaped plane, such that a right oblique side thereof passes through an optical axis of said at least one lighting unit, and is about a half pitch apart from a pitch of an adjacent one of said at least one lighting unit of said third lighting system.

14. The lamp of claim 6, wherein said parallelogram-shaped light emitting units have oblique sides inclined at about 45 degrees in a right upward direction with respect to substantially horizontal upper and lower sides of said light emitting units.

* * * * *